United States Patent [19]

Wilson et al.

[11] 4,369,090

[45] Jan. 18, 1983

[54] PROCESS FOR ETCHING SLOPED VIAS IN POLYIMIDE INSULATORS

[75] Inventors: Arthur M. Wilson, Richardson; David W. Laks, Dallas, both of Tex.; Stephen M. Davis, Oakland, Calif.

[73] Assignee: Texas Instruments Incorporated, Dallas, Tex.

[21] Appl. No.: 204,409

[22] Filed: Nov. 6, 1980

[51] Int. Cl.³ .................... B44C 1/22; C03C 15/00; C03C 25/06
[52] U.S. Cl. ........................... 156/644; 156/659.1; 156/668; 252/79.5; 430/317
[58] Field of Search ............ 156/644, 652, 654, 655, 156/659.1, 661.1, 668; 252/79.5; 427/307; 430/317

[56] References Cited

U.S. PATENT DOCUMENTS

| 3,361,589 | 1/1968 | Lindsey | 156/629 X |
| 4,039,371 | 8/1977 | Brunner et al. | 156/655 X |
| 4,113,550 | 9/1978 | Saiki et al. | 156/668 X |

Primary Examiner—William A. Powell
Attorney, Agent, or Firm—Mel Sharp; Rich Donaldson; Gary Honeycutt

[57] ABSTRACT

A method for the fabrication of a cured polyamic acid film having apertures therein selectively etched to provide sidewalls sloped at a controlled angle. Such films are used in the fabrication of integrated circuits having two or more levels of metallization, to provide electrical insulation between metal levels. The apertures therein are required to have sloped sidewalls in order to enhance the yields of circuits having reliable contact between metal levels.

2 Claims, 9 Drawing Figures

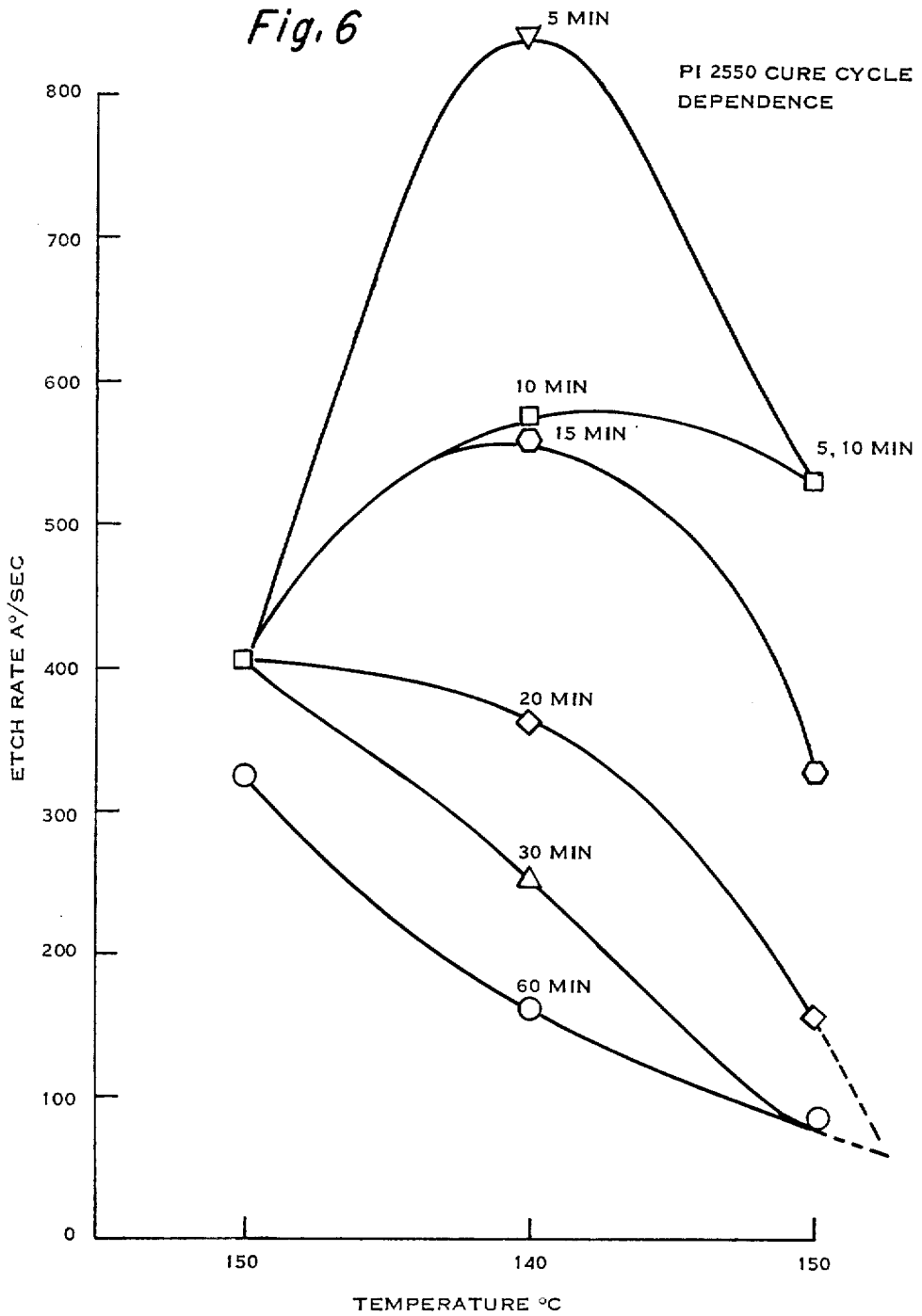

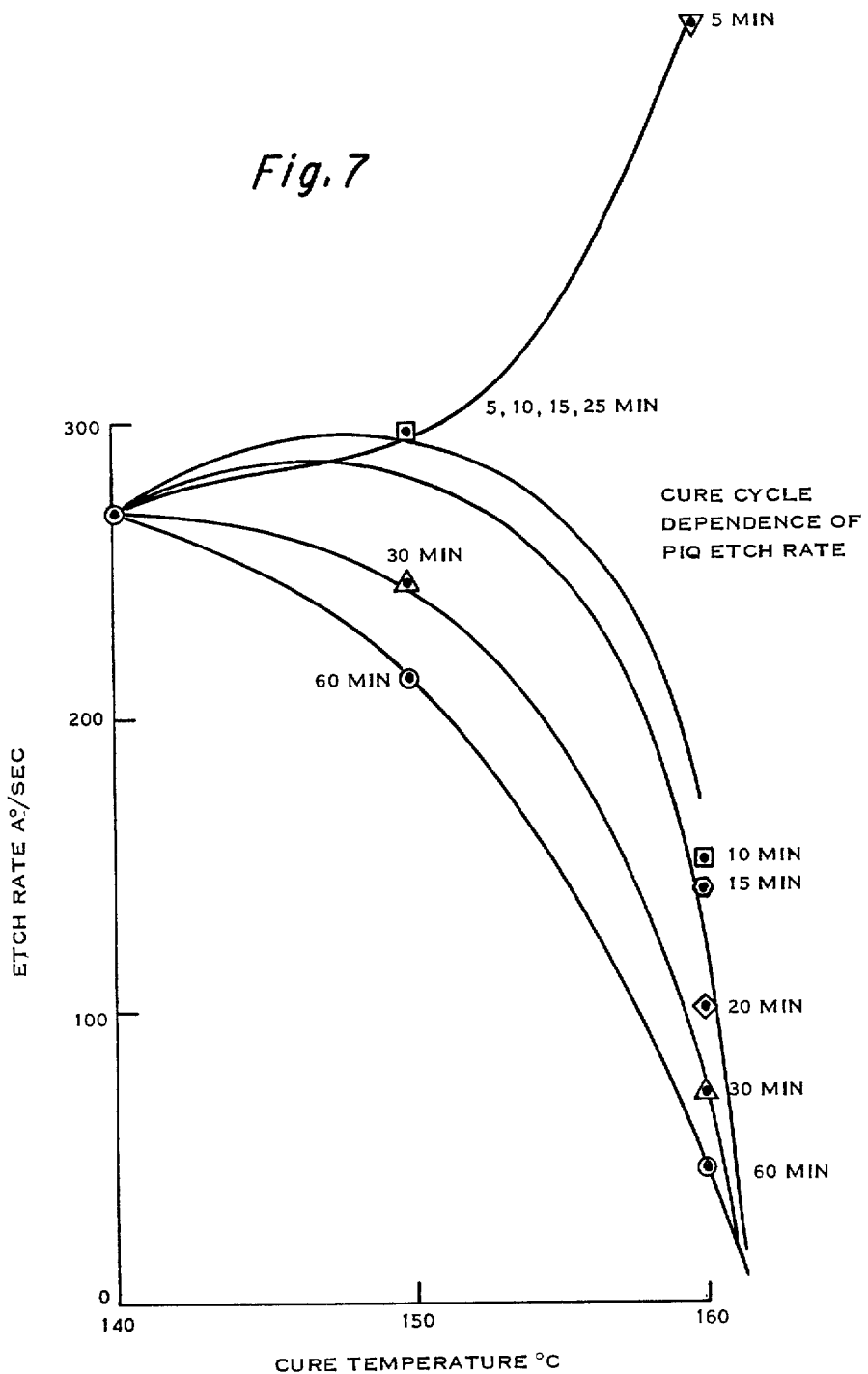

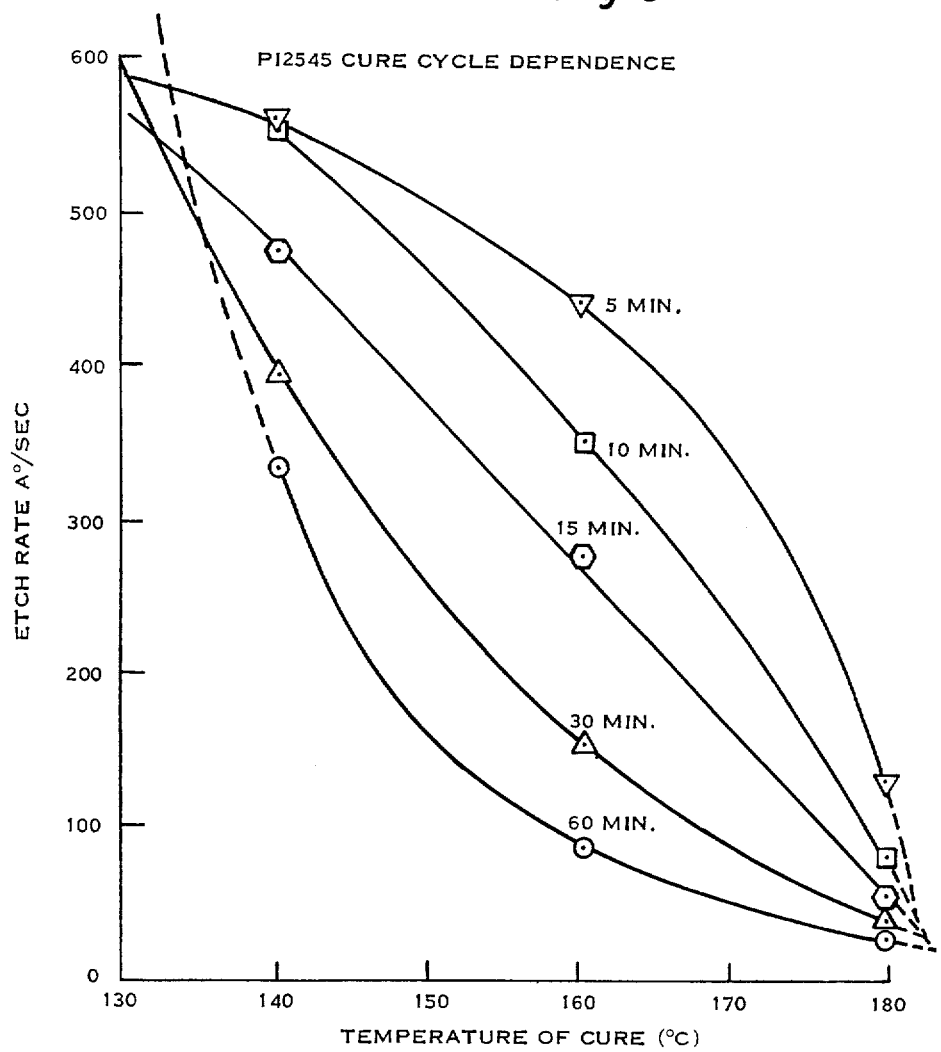

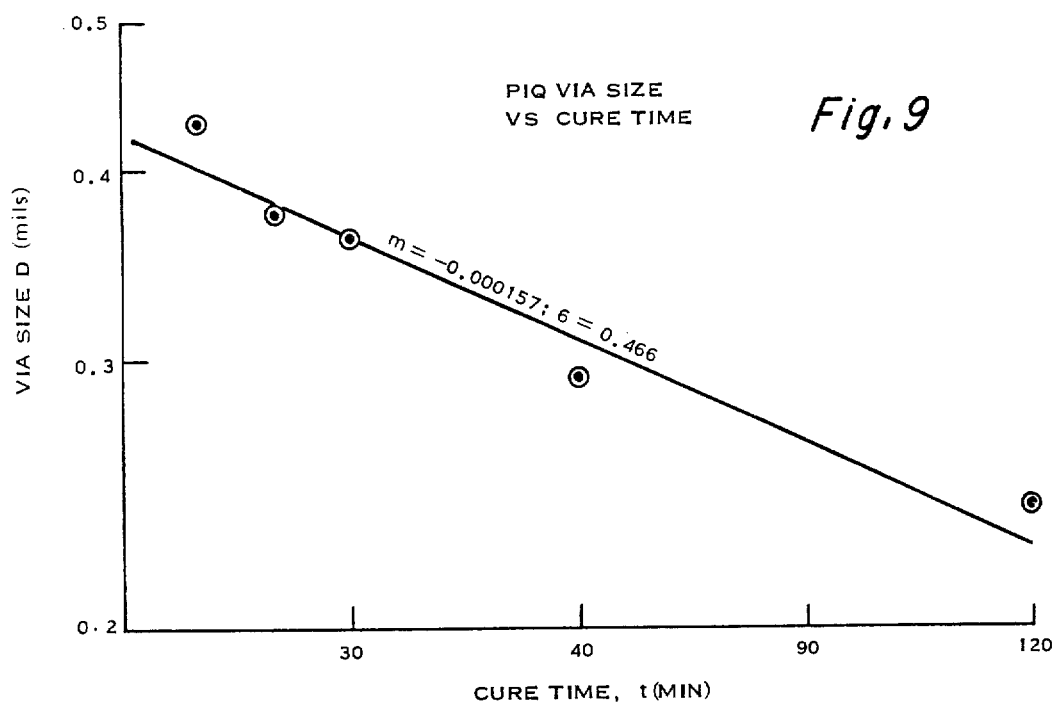

PROCESS FOR ETCHING SLOPED VIAS IN POLYIMIDE INSULATORS

This invention relates to the fabrication of apertured insulation films, and more particularly to the fabrication of integrated circuits having such films as insulation between metallization levels.

The advent of very large scale integrated circuit (VLSI) technology places increasing demands on multi-level interconnection systems. As the minimum features become smaller, e.g. 2 $\mu$m gates in 64 K random access memories (RAM), the control of these dimensions demands less high temperature processing ($\leq 600°$ C.) once the structure is established in the silicon. Thus, a glass insulator requiring a 975° C. reflow operation becomes less viable as a mutilevel insulator. Furthermore, the better pattern fidelity required to produce 3 $\mu$m lead widths and spaces, results in a vertical walled lead. Insulator coverage of these topographics becomes increasingly difficult for chemical vapor deposition technologies, which tend to preferentially nucleate on edges and points. The resultant reentrant folds in turn make metal coverage incomplete at these steps. The use of low temperature curing ($\leq 350°$ C.) polyimides as a replanarizing insulator has been suggested as a solution to this problem.

In order to fabricate a multilevel interconnect system feed-through holes, or "vias", must be formed in the insulator. Although they are a desirable insulator, the patterning of polyimides is a problem because of their chemical inertness. A solution of 44% hydrazine in an alkylamine has been used as an etchant. However, because of its toxicity and fire hazard, the etchant cannot be recommended for general use. Others have used an oxygen plasma and a positive resist mask to pattern vias down to 3.5 $\mu$m$^2$. Since the ash rate of the positive resist and polyimide are about the same, for any plasma condition, the resist must be thicker than the polyimide film, preferably twice as thick. Under these conditions 60°–70° via wall slopes were reported. J. C. Yen (Electrochem Soc., Abstract No. 170, Spring Meeting 1975) has reported using AZ1350J resist and AZ1350J developer to simultaneously develop the resist image and etch the pattern in the partially cured polyamic acid resin. None of these prior workers have considered the importance of the cure time and temperature or the degree of imidization on controlling the etch rate or the slope of the via wall.

Dupont has used a differential IR spectroscopic technique to determine the degree of imidization of their Type I (PI 2540 series) and Type III (PI 2550 series) resins. It was determined that this information could be used as a starting point to develop a reproducible process based on partial imidization. It was further realized that the mechanism for providing a tapered via wall had to be created by an etch rate gradient across the film if it was to be a reproducible process. An object of this invention, therefore, is to define the cure conditions most conducive to etching vias with 50°–70° slopes and maximum image fidelity.

One aspect of the invention is embodied in a method for the fabrication of a cured polyamic acid film having tapered apertures therein, beginning with the step of forming a polyamic acid film on a suitable substrate, then curing the film to cause partial imidization thereof, at a critical range of temperatures, then selectively etching apertures in the partially cured film, whereupon the desired tapering effect is obtained, due to the nature of the curing step.

It has now been discovered in accordance with the invention that the etch rate of partially cured polyamic acid films is not uniformly dependent upon the time and temperature of curing, i.e., conversion to polyimide. Moreover, a given percent of imidization does not determine what the etch rate will be in a given etch solution.

That is, each species of polyamic acid has a characteristic pair of narrow ranges of curing temperatures for which the etch rate of the resulting partially imidized film is not substantially dependent upon cure time. These cure temperatures or ranges are designated as the "lower chronostatic temperature," and the "upper chronostatic temperature." Thus, it has been discovered that curing at either the lower or the upper chronostatic temperature is essential in order (1) to achieve easily reproducible etch rates, and (2) to achieve suitable taper angles for the side walls of etched apertures in the partially imidized films. Specifically, the side walls must slope outward at 50°–70° from the bottom of the aperture, giving the apertures a kind of dish-shaped cross-section.

Another aspect of the invention is embodied in a method for etching partially cured polyamic acid films, comprising the step of selectively exposing the film to a quaternary amine base in aqueous alcohol solution. For example, a partially imidized film is etched in an aqueous isopropanol solution of tetramethylammonium hydroxide.

Still another aspect of the invention is embodied in a process for the fabrication of a semiconductor integrated circuit having more than one level of metallization, with apertured interlevel insulation between metal levels fabricated in accordance with one or more of the above aspects of the invention.

That is, first level metal is patterned on the circuit, followed by the formation thereon of a polyamic acid film, followed by partial curing or imidization of the polyamic acid at a critical temperature, followed by selective etching to obtain tapered apertures, followed by second level metallization to establish the desired contact with first level metallization through the tapered apertures.

For a detailed disclosure of integrated circuit fabrication, including multilevel metallization, see U.S. Pat. No. 3,507,766 issued Apr. 21, 1970 to Cunningham et al, incorporated herein by reference.

Chemicals and Materials—PI2545 (Type I polyamic acid) and PI2555 (Type III) obtained as a 10–12 poise, 14% and 20% solids respectively, solutions from I. E. Dupont, Marshal Laboratories, P.O. Box 3886, Philadelphia, PA. 19146. PIQ (polyamic acid isoindroquinazolinedione) resin was supplied as an 11 or 16 poise, 14.5% solids solution from Hitachi Chemical Co., America Ltd., 437 Madison Avenue, New York, N.Y. 10022. Specifically, see Hitachi patent U.S. Pat. No. 4,040,083 issued Aug. 2, 1977. Semiconductor grade 76 mm diameter, 0.45–0.55 mm thick silicon wafers with 2 KÅ thermally grown silicon oxide were used as substrates on which to cast all thin polyimide films. Resins were used as received or filtered through Balstron No. 100-12-AAQ filter (0.3 $\mu$m average pore size) in a Type 33G holder. MF312 is a 5% by weight tetramethyl ammonium hydroxide (TMAH) solution from the Shipley Company, Newton, Mass. 02162. The polyimide etchant was prepared by mixing one part of MF312 with seven parts isopropyl alcohol (IPA) making a 0.6–0.7% TMAH solution. Waycoat I.C. Type 3, 28 photoresist solution was used as received from the P. A. Hunt Co., Palisades Park, N.J. 07650. Equipment—A Macronetic Model C-1000 coater was used for spin casting of polyimide and photoresist films. Differential scanning calorimetry (DSC) was done with a Dupont Model 990 thermal analyzer. An Aminco thermalanalyzer equipped with a Marshall Furnace was used for thermal gravimetric analysis (TGA). Film thicknesses were measured by spectrometry with a Nanospec thin film analyzer assuming a refractive index of 1.78 for the cured film. Procedures—Polyamic acid films were cast by delivering 1.5 to 2.0 ml of resin to the center of a non-spinning 76 mm dia wafer, by means of a positive displacement, bellows-type pump: Spinning then progressed via 1K rpm/sec$^2$ ramp to speeds of 2K to 6K rpm for 20 seconds. Cured 2 to 4 micron thick films were prepared in this way. Films were dried 20 minutes at 80°±10° C. while held horizontally in a 25" mercury vacuum. B-stage cures were controlled to ±3° C. in a forced air oven.

TGA and DSC samples were studied as free films. After a 30 minute curve at 120° C. the film was removed from the wafer by applying a cellophane tape across an edge of the polymer film and a supporting paper; the film and wafer were then inverted and an approximate 180° peeling force applied leaving the film attached to the paper via the cellophane tape. The sample was cut free and either stored or cured further before thermal analysis.

Samples for patterning experiments remained on the wafer and were cured for additional b-stage time at temperatures selected for the particular polyamic acid resin. Photoresist was coated 7KÅ thick and 0.2 mil (5 μm) openings were exposed and developed by standard techniques. A 30 minute 135° C. bake was used to dry the resist and increase the adhesion of the photoresist to the polyimide.

FIGS. 6–8 are curves showing the cure cycle dependence of etch rates for various cured polyamic acid films.

FIG. 9 is a plot of Via Size vs. Cure Time for a cured polyamic acid film.

Figure 1:
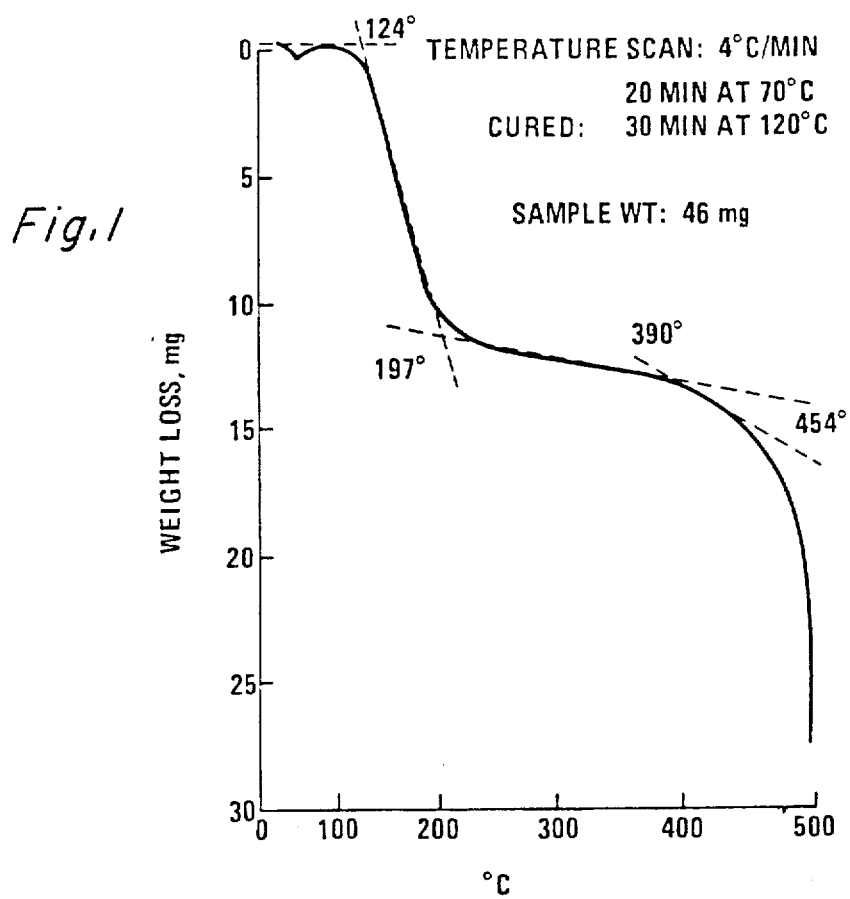
FIG. 1 is a weight loss curve obtained by thermogravimetric analysis of cured polyamic acid.

Thin films of polyamic acids, applied by spin coating technique, retain a large amount of the NMP solvent system and, though quite viscous, still flow if the wafer surface is made vertical. For this reason wafer surfaces must remain horizontal until baked for 20 minutes at 70° C. Even after a preliminary cure of 20 minutes at 70° C. and 30 minutes at 120° C. the resin still retains 20 to 25% by weight of the NMP solvent. A typical weight loss for Dupont PI2545 resin is shown in the TGA of FIG. 1. The solvent loss is nearly complete by 197° C. The onset of a small (approximately 2%) weight loss at 390° is due to intermolecular and intramolecular hydrogen bound water, which we have reported previously. Finally, at 454° C. the polyimide oxidatively decomposes.

Figure 2:
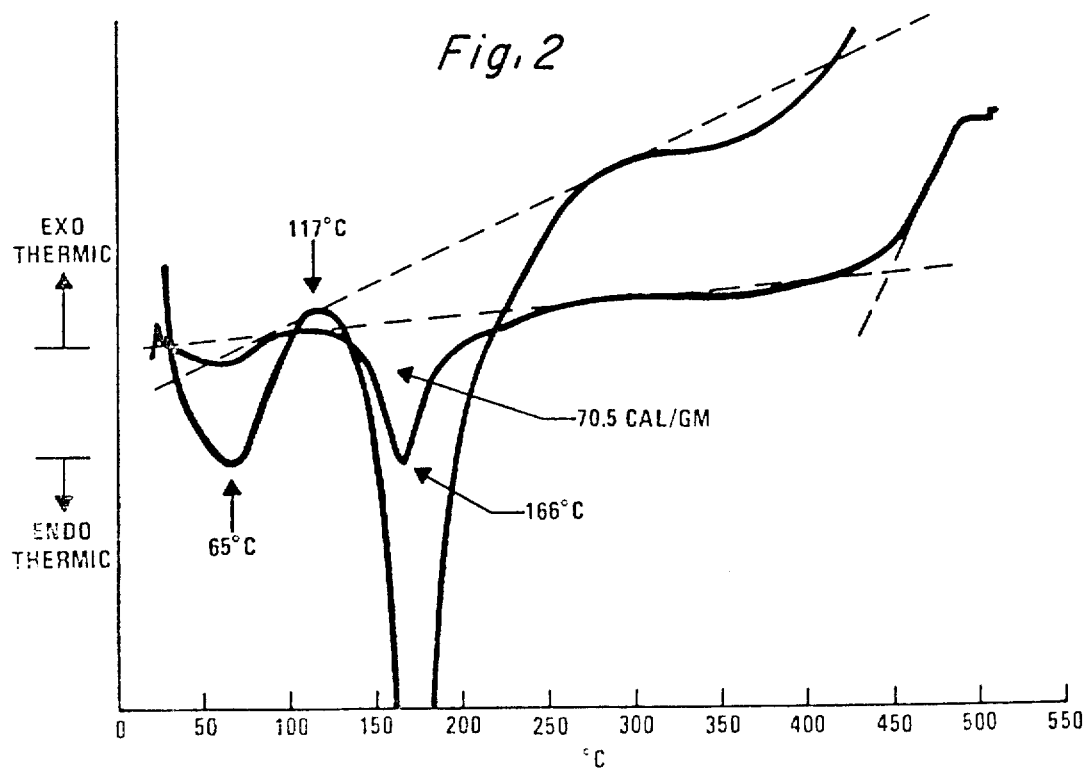
FIGS. 2 and 3 are differential scanning calorographs of cured polyamic acids.
Figure 3:
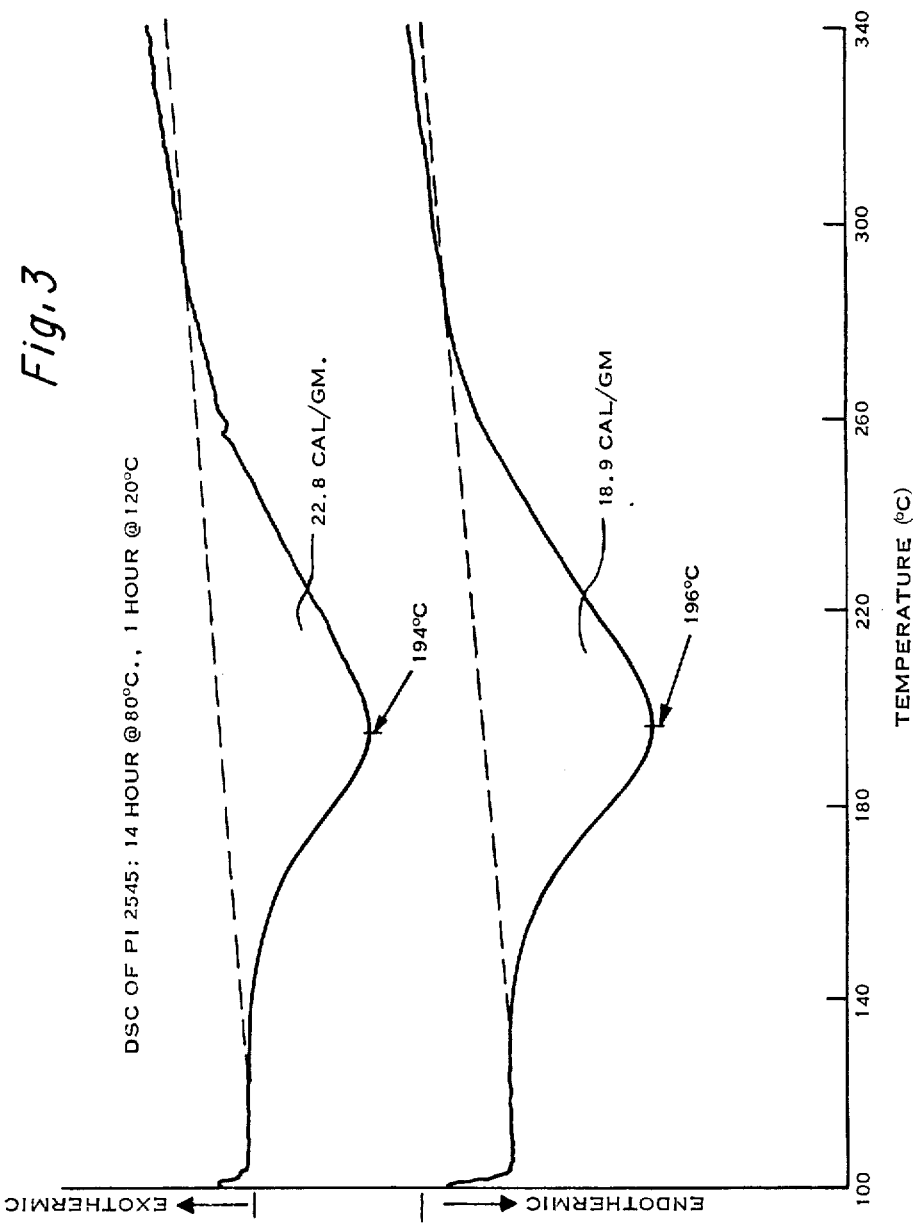

The DSC curve of PI2545 shown in FIG. 2 has a small endothermic peak at 65° C. due to weakly absorbed water. This peak was never present in samples dried to 120° C. and stored in a desiccator previous to the DSC determination; this sample was stored at a room ambient of 35–45% RH and 23° C. The peak at 166° C. is present in samples of PIQ and PI2555 as well if cured for only 20 minutes at 70° C. and 30 minutes at 120° C. This peak will shift to higher temperature and lower caloric content with prolonged vacuum cures at 80° C. as shown in FIG. 3. The shift in peak temperature and the decrease in caloric content of the PI2545 resin due to increasing cure times at successively higher temperatures are summarized in Table I.

TABLE I

| Differential Scanning Calorimetric Analysis | | | | |
|---|---|---|---|---|
| Vacuum Cure Time of Dupont PI 2545 @ 70–90° C. | Forced Air Cure Time | | Ave. Heat of Reaction Cal/gm | $T_{max}$ °C. |
| | @ 120° C. | @ 180° C. | | |
| 20 Min. | 0.5 hrs | + 0 min. | 70.5 | 166 |
| 14 hrs | 1.0 hrs | + 0 min. | 20.7 | 196 |
| 14 hrs | 24.0 hrs | + 0 min. | 13.8 | 216 |
| 14 hrs | 24.0 hrs | + 5 min. | 13.0 | 222 |
| 14 hrs | 24.0 hrs | + 10 min. | 9.3 | 232 |
| 14 hrs | 24.0 hrs | + 15 min. | 7.7 | 238 |
| 14 hrs | 24.0 hrs | + 20 min. | 8.4 | 238 |

It appears that 80% of the endothermic energy of the peak at 166° C. is used in evaporating solvent and that the remaining 20% is associated with the imidization reaction. Dupont's IR data on PI2545 indicates films are 50% imidized after 30 at 150° C. and over 90% imidize after 30 minutes at 180° C.. Furthermore, the specific caloric content of PIQ and PI2555 films cured for 20 minutes at 70° C. vacuum and 30 minutes at 120° C. in air are only 57 and 59 cal/gm respectively compared to the 70.5 cal/gm, specific caloric content of PI2545. These films are known to be imidized at even lower temperatures than PI2545. It is apparent that the imidization reaction is not a concerted process and that the continued endothermic input up to 250° C. may be required for the internal structural rearrangement as well as the imide ring closure reaction. It is not possible to define the optimum b-stage cure conditions for a photolithographic process from thermal analysis alone.

Figure 4:
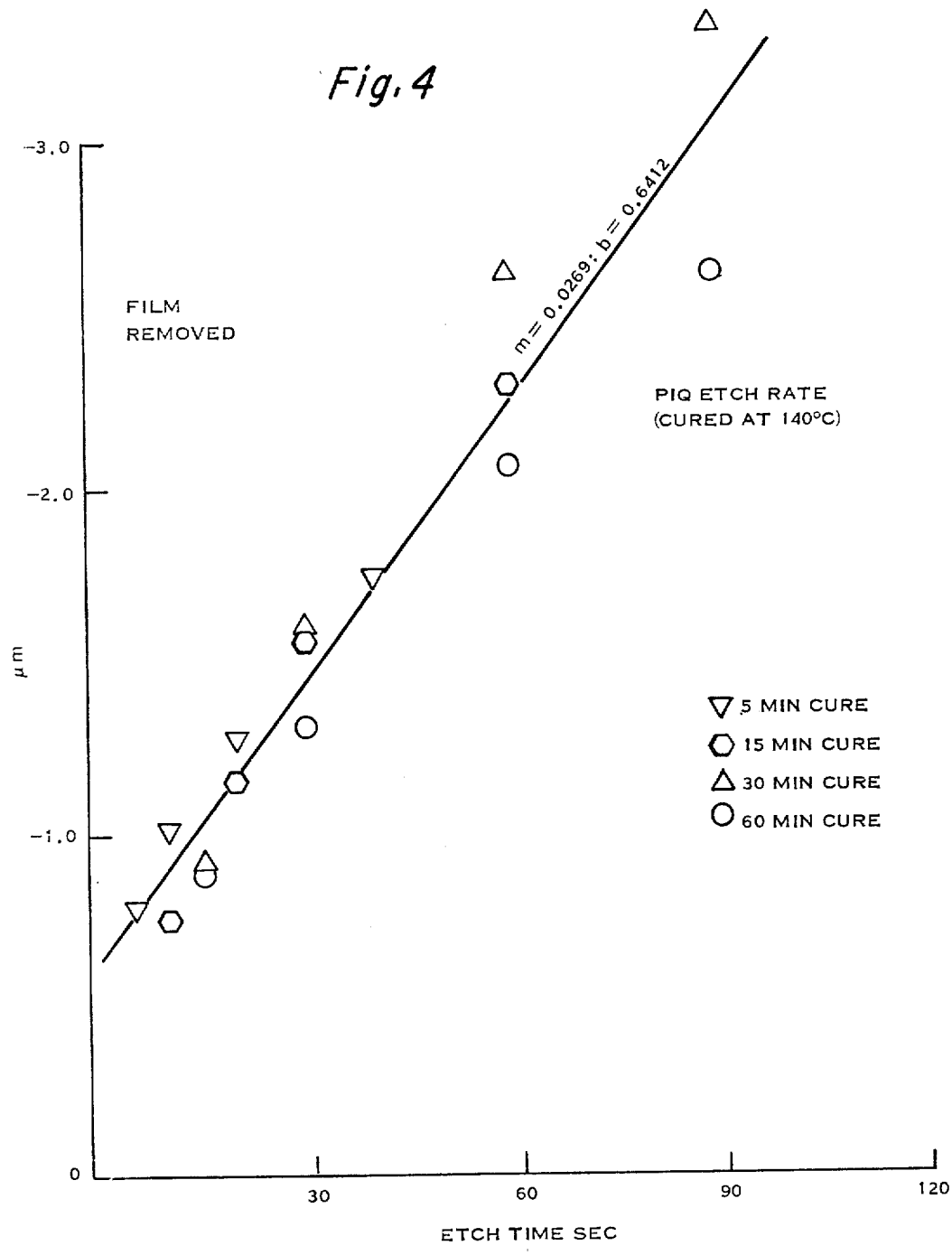
FIG. 4 is a plot of the etch rate in tetramethylammonium hydroxide of cured polyamic acid films having different cure times at 140° C.
Figure 5:
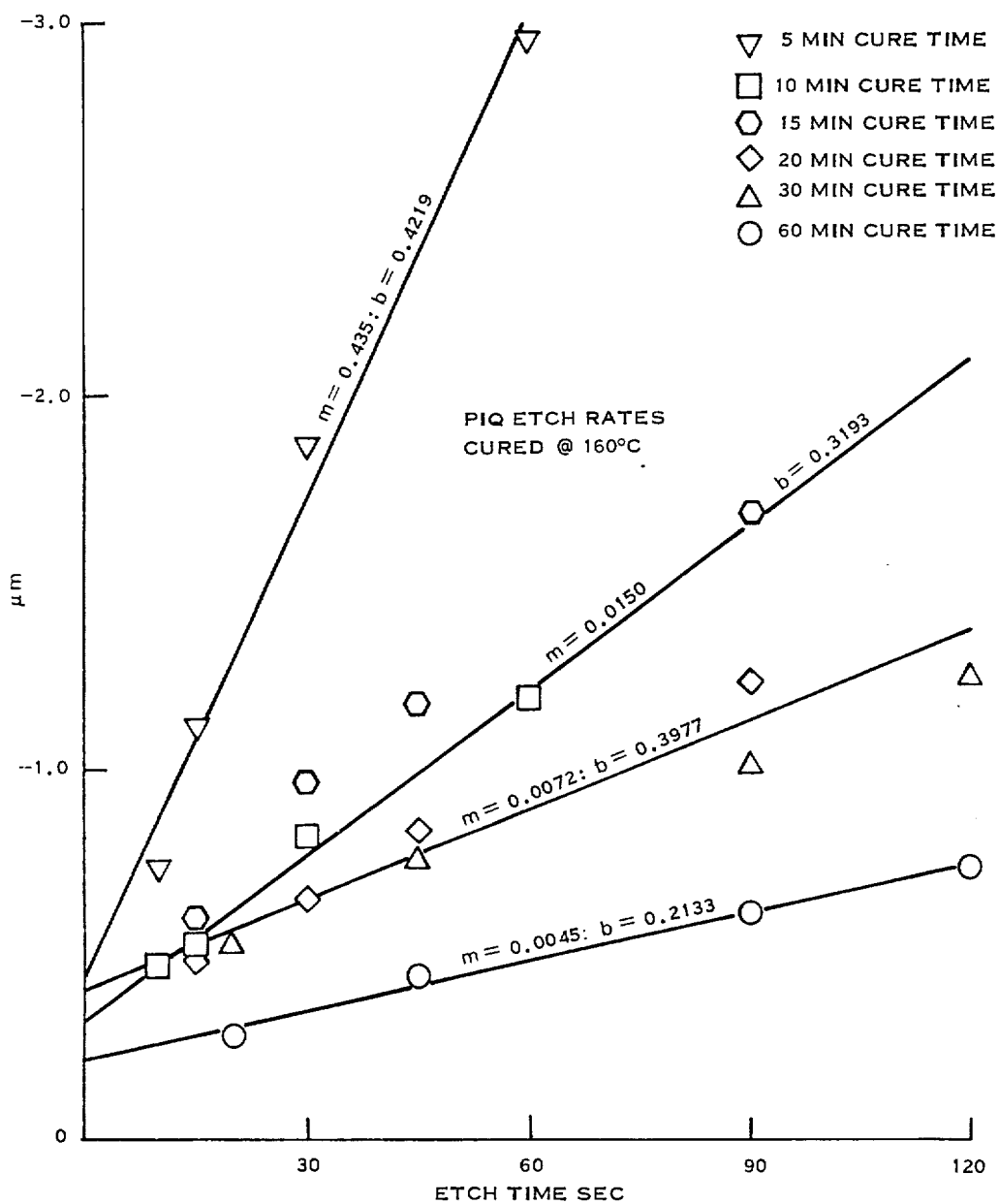
FIG. 5 is a plot of the etch rates in tetramethylammonium hydroxide of cured polyamic acid films having different cure times at 160° C.

Etch Rate Analysis—Typical PIQ film removed vs etch time in 0.6% TMAN 12.5% water/IPA is shown in FIG. 4 and FIG. 5 for cure temperatures of 140° and 160° C. At 140° C., the data is fitted very well by a single straight line, independent of the cure time from 5 to 60 minutes. At 160° C., the slope and intercept become more dependent on cure time. The etch rate curves all have characteristic high intercepts, in general the lower the cure temperature the higher the intercept. This merely means the surface layer of the polyimide is subject to a faster etch rate than the layers closest to the silicon dioxide interface. Since good straight line fits were obtained at longer etch times these slopes were chosen as the representative etch rates. This data is plotted in FIGS. 6, 7 and 8 for PI2555, PIQ and PI2545 at three selected cure temperatures for each resin. The convergence of the cure time curves to a single characteristic etch rate at low temperature is striking. The convergence point at the higher temperature is less well defined. It is apparent that once the resin is cured for a minimum time, approximately fifteen or more minutes, the etch rate has a very low dependence on further cure time. Furthermore, the etch rates are high, 300 to 500 Å/sec, at the low cure temperature and low, <100 Å/sec, at the high cure temperature. In the transition temperature range there is a much greater dependence of the etch rate on cure time. It seems convenient to describe the temperature at which the etch rate has low dependance on cure time as a chronstatic temperature and the transition region as a chronodynamic temperature region. These characteristic temperature regions are summarized in Table II for the three resin systems.

TABLE II b-Stage Cure Sensitivity of Polyimides
ETCH RATES IN 0.6% TMAH, 12.5% H20/IPA

| Polyimide | PIQ | PI2540 | PI2550 |
|---|---|---|---|
| CHRONOSTATIC TEMPERATURES: | | | |
| Low, °C. | 140 | 150 | 125 |
| Etch Rates, Å/Sec | 270 | 550 | 400 |
| High, °C. | 165 | 205 | 155 |
| Etch Rate, Å/Sec | ≦10 | 20 | 50 |
| CHRONODYNAMIC | | | |
| Temperature; °C. | 155 | 175 | 140 |
| Optimum time, min | 28 | 15 | 30 |
| Median Rate, Å/Sec | 210 | 320 | 255 |
| Temp. Coef., Å/Sec/°C. | −17 | −11 | −16 |
| Time, Coef., Å/Sec/Min | −5.5 | −18 | −11 |
| Temperature & Time Control for ≦20% variation in etch rate | | | |
| Temp, °C. | ±2.5 | ±5.8 | ±3.1 |
| Time, Min | ±7.6 | ±3.6 | ±4.6 |

The large temperature and cure time coefficients indicate a great sensitivity of the etch rate in the chronodynamic range.

Patterning Characteristics of Partially Cured Polyamic Acids—In order to evaluate the impact of cure temperature on patterning characteristics, films were cured at the chronostatic temperatures and the median temperature of the chronodynamic range. Films cured at or below the lower chronostatic temperature were etched with reproducible clear times for 5 μm and 100 μm openings. FIG. 9 shows the deviation of a typical 0.2 mil (5 μm) via as a function of cure time for PIQ cured at 140° C. up to two hours. Typical via wall slopes are shown in FIG. 10 as a function of cure time. The optimum cure time appears to be two hours. Films cured in the chronodynamic region can provide proper 50° to 70° slopes, however, clearing times are erratic because of the tight control of time and temperature needed to get to the same state of solvent removal and imidization. Films cured at the higher chronostatic temperature require long clearing times and do not appear to clear uniformly with the dilute, 0.6% TMAH, 12.5% H20/IPA etchant. Furthermore, due to the long etch times via walls have flatter slopes (30°-45°) and irregular edges due to loss of resist adhesion and general breakdown of the negative resist mask. Faster etch rates and properly sloped vias can be obtained in films cured at the higher chronostatic temperature with a more concentrated etchant. A mixture comprising 10–25% TMAH in a 25% to 50% water/IPA solution is optimum.

The lower temperature allows the complete removal of NMP solvent with a relatively low degree of imidization (50-70%), thus a long cure time provides a slightly faster surface etch rate which assures a 50°-70° slope and a uniform but fast etch rate. The higher temperature causes too high a degree of imidization which slows down the etch rate. Due to fast solvent removal in these temperature ranges there are probably large temperature gradients within the polyamic acid film, which in turn creates an imidization gradient with lower fractional imidization at the air-film interface. This produces oversloped walls and difficultly cleared layers at the polyimide-silicon dioxide interface with the dilute etchant.

Differential scanning calorimetric analysis of polyamic acid films has a single broad endothermic peak in the temperature range of 165° to 205° C. The single peak represents the energy requirement for both the solvent evaporation and the internal imidization ring closure. NMP evaporation requires approximately 80% of the specific energy content of this peak. Plots of etch rate data as a function of temperature and time of cure provide a convergence point at low cure temperature. This lower chronostatic temperature has been shown to be an optimum cure temperature for etching vias with 50°-70° walls.

Suitable etchants for patterning a partially cured polyamic acid film include aqueous KOH or NaOH, or aqueous-alcoholic solutions of KOH or NaOH. For best results, however, it is essential to use the etchant of the invention, comprising an aqueous-alcoholic solution of tetramethylammonium hydroxide (TMAH) preferably 0.5 to 1.0% TMAH in an isopropanol-water solution, having 5-10 volumes of IPA per volume of H20, for etching film cured at the lower chronostatic temperature. For best results at the higher chronostatic temperature the preferred etchant of this invention comprises an aqueous-alcoholic solution of tetramethyl ammonium hydroxide (TMAH) or concentration of 10 to 25% TMAH in an isopropanol-water solution having 1-3 volumes of IPA per volume of water.

We claim:

1. A method for the fabrication of a partially cured polyamic acid film having tapered apertures therein, comprising the steps of:
   (a) forming a polyamic acid iso-indroquinazolinedione resin film on a suitable substrate;
   (b) curing said film at or near its upper chronostatic temperature of 165° C.
   (c) selectively masking the resultant cured film with an operational resist, and
   (d) exposing the masked film to an etchant containing 10-25% by weight tetramethyl ammonium hydroxide whereby tapered apertures are etched in the more completely cured film.

2. A method as in claim 1 wherein said etchant is an aqueous alcohol solution of tetra-methyammonium hydroxide.

* * * * *